（12）United States Patent
Yuan et al.

(10) Patent No.: US 9,240,778 B2
(45) Date of Patent: Jan. 19, 2016

(54) ANALOG BREAK BEFORE MAKE SYSTEM, METHOD AND APPARATUS

(71) Applicant: SanDisk Technologies Inc., Plano, TX (US)

(72) Inventors: Henry H. Yuan, Fremont, CA (US); Steve X. Chi, Cupertino, CA (US); Ekram H. Bhuiyan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/254,875

(22) Filed: Apr. 16, 2014

(65) Prior Publication Data

US 2015/0303911 A1    Oct. 22, 2015

(51) Int. Cl.
*H03K 17/081* (2006.01)
*H03K 19/0175* (2006.01)

(52) U.S. Cl.
CPC .. *H03K 17/08104* (2013.01); *H03K 19/017509* (2013.01)

(58) Field of Classification Search
CPC ............ H01L 27/1225; H01L 27/3262; H01L 27/124; H01L 29/04; H01L 23/043; G11C 19/28; G11C 11/4076; G11C 11/1675; G11C 16/28; G11C 16/08
USPC .................. 327/108, 109, 111, 112
See application file for complete search history.

(56) References Cited

U.S. PATENT DOCUMENTS

| | | | |
|---|---|---|---|
| 5,155,379 A | 10/1992 | Narahara | |
| 5,930,132 A | 7/1999 | Watanabe et al. | |
| 2006/0001459 A1 | 1/2006 | Audy | |
| 2009/0072864 A1 | 3/2009 | Hagino | |
| 2009/0121752 A1* | 5/2009 | Lin | 327/112 |
| 2010/0085675 A1 | 4/2010 | Oki | |

OTHER PUBLICATIONS

ISR PCT/US2015/021170, Jun. 3, 2015, 13 pages.

* cited by examiner

*Primary Examiner* — John Poos
(74) *Attorney, Agent, or Firm* — Martine Penilla Group, LLP

(57) ABSTRACT

A system and method of providing an analog make before break circuit includes a first transistor coupled in series with a second transistor, the first transistor being configured for conducting a high portion of an input signal, the second transistor being configured for conducting a low portion of the input signal. A third transistor is configured to interrupt a connection between the input signal and a first transistor input node, the third transistor having a third transistor threshold voltage between of about 90 and about 110 percent of a second transistor threshold voltage. A fourth transistor is configured to interrupt a connection between the input signal and a second transistor input node, the fourth transistor having a fourth transistor threshold voltage of between about 90 and about 110 percent of a first transistor threshold voltage.

20 Claims, 9 Drawing Sheets

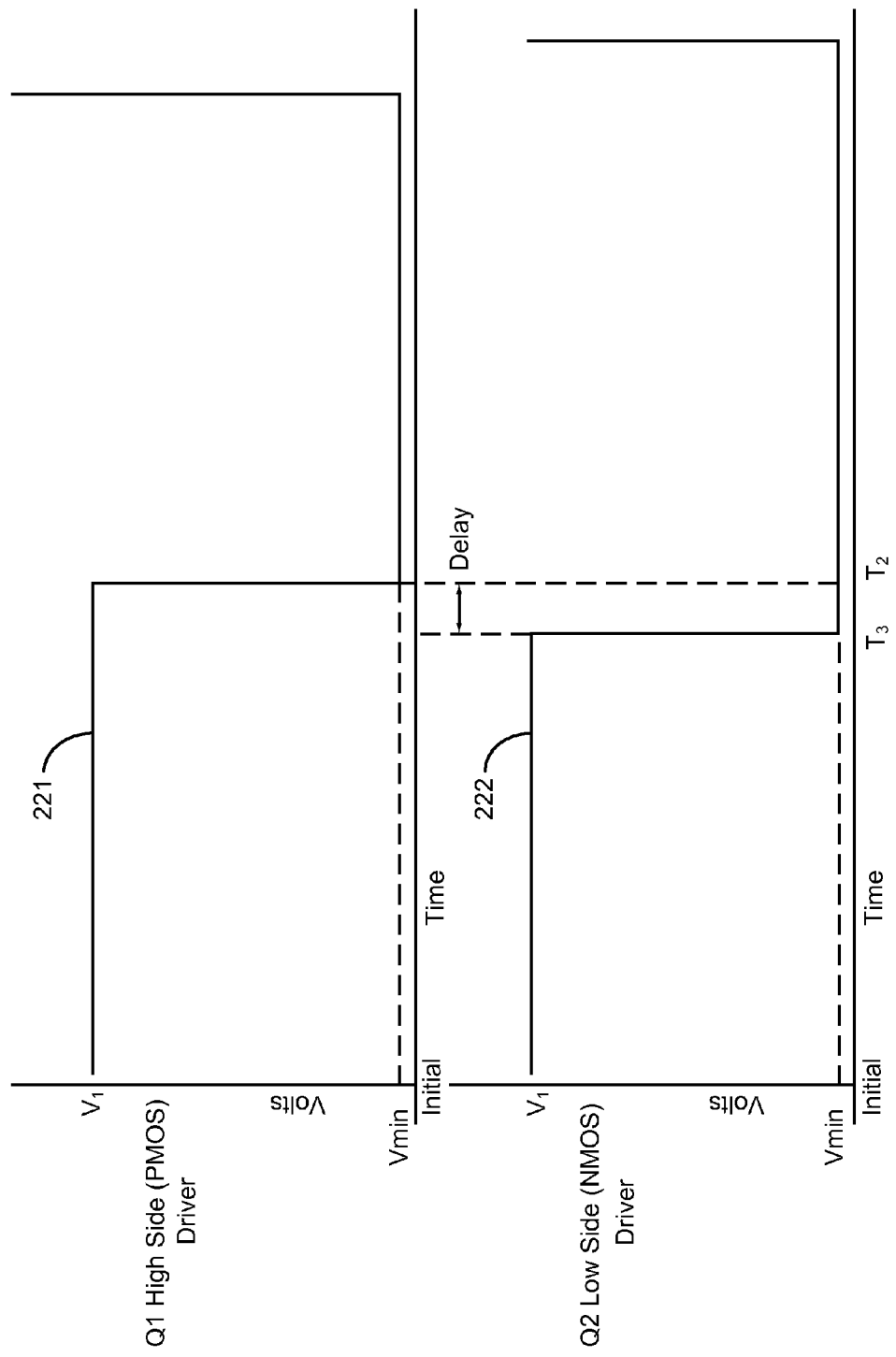

ANALOG BREAK BEFORE MAKE SYSTEM, METHOD AND APPARATUS

BACKGROUND

The present invention relates generally to driving circuits and methods, and more particularly, to systems, methods and apparatus for timing the conductance of driver circuits.

FIG. 1A is a typical driver circuit 100. A PMOS high side transistor Q1 is connected in series with an NMOS low side transistor Q2. The respective input nodes 101 and 102 of the high side transistor Q1 and the low side transistor Q2 are cross coupled through respective driver/gates 111, 113 and 112, 114, so that as high side transistor begins to shut off (i.e., stop conducting), the low side transistor is gated to on (i.e., begin conducting). Transistor Q1 is a PMOS transistor and transistor Q2 is a NMOS transistor in the present example, however, the types of transistors can vary.

However, due to various circuit dynamics, such as parasitic capacitance, slow gate turn off ramp and other issues, one high side transistor does not turn off and stop conducting instantaneously and before one low side transistor turns on and begins conducting. FIGS. 1B and 1C are graphical representations of gate voltages applied to the typical driver circuit 100. In an initial state, transistor Q1 is non-conducting (state 0) and transistor Q2 is conducting (state 1).

A Q2 gate voltage 122 has an initial value for fully conducting state 1 at time T0. The Q2 gate voltage 122 has a downward slope as the Q2 gate voltage gradually decreases between time T0 and time T4. At time T0, the Q2 gate voltage 122 is enabled. However, the Q2 gate voltage 122 does not drop to minimum level Vmin, instantaneously as discussed above. At a time T3, the Q2 gate voltage 122 drops below a threshold voltage $V_{TN}$ for transistor Q2 and Q2 stops conducting. The Q2 gate voltage 122 continues to decrease to the minimum voltage Vmin at time T4.

Similarly, a Q1 gate voltage 121 has an initial value for fully non-conducting state 0. Q1 gate voltage 121 has a downward slope as the gate voltage gradually decreases between time T1 and time T5. At time T1, the Q1 gate voltage 121 is disabled or removed. However, the Q1 gate voltage 121 does not drop to minimum level Vmin instantaneously, as discussed above. At a time T2, the Q1 gate voltage 121 drops below a threshold voltage $V_{TP}$ for transistor Q1 and Q1 begins conducting. The Q1 gate voltage 121 continues to drop to minimum level Vmin at time T5 and Q1 continue to conduct between time T2 and beyond time T5.

As shown above, transistor Q2 is still conducting between time T2 and time T3 and therefore, when transistor Q1 begins conducting at time T2, then a current spike can occur through the series transistors Q1, Q2 until time T3, when Q2 stops conducting. The current spike consumes excess power and can cause component damage.

FIG. 1C illustrates the inverse of the switching sequence shown in FIG. 1B. The inverse switching sequence can result in a second current spike when transistor Q2 begins conducting at time T8 before the transistor Q1 stops conducting and time T9.

What is needed is a system and method to confirm the presently conducting transistor is actually in a fully non-conducting state 0 before the presently non-conducting transistor actually begins conducting and thus prevent the series current spikes described above between times T2 and T3 and between times T8 and T9.

SUMMARY

Broadly speaking, the present invention fills these needs by providing a driver circuit that does not suffer series current spikes. It should be appreciated that the present invention can be implemented in numerous ways, including as a process, an apparatus, a system, computer readable media, or a device. Several inventive embodiments of the present invention are described below.

One embodiment provides an analog make before break circuit including a first transistor coupled in series with a second transistor, the first transistor being configured for conducting a high portion of an input signal, the second transistor being configured for conducting a low portion of the input signal. A third transistor is configured to interrupt a connection between the input signal and a first transistor input node, the third transistor having a third transistor threshold voltage between of about 90 and about 110 percent of a second transistor threshold voltage. A fourth transistor is configured to interrupt a connection between the input signal and a second transistor input node, the fourth transistor having a fourth transistor threshold voltage of between about 90 and about 110 percent of a first transistor threshold voltage.

The third transistor configured to interrupt the connection between the input signal and the first transistor input node can include coupling a third transistor input node to the second transistor input node, coupling the input signal to a first NOR gate input node, coupling a third transistor output node to a second NOR gate input node and coupling a NOR gate output node to the first transistor input node.

The fourth transistor configured to interrupt the connection between the input signal and the second transistor input node can include coupling a fourth transistor input node to the first transistor input node, coupling the input signal to a first AND gate input node, coupling a fourth transistor output node to a second AND gate input node and coupling an AND gate output node to the second transistor input node.

The first transistor threshold voltage can be substantially equal to the fourth transistor threshold voltage. The second transistor threshold voltage can be substantially equal to the third transistor threshold voltage. The first transistor threshold voltage can be substantially equal to the second transistor threshold voltage. The first transistor threshold voltage may not equal to the second transistor threshold voltage in at least one embodiment.

The first transistor can be coupled in series with the second transistor between a supply voltage source and a ground. The circuit can also includes an analog make before break circuit output node coupled between a first transistor output node and a second transistor output node.

Another embodiment provides a method of providing an analog make before break including coupling an input signal from an analog make before break circuit input node an to a first transistor input node. A first transistor is coupled in series with a second transistor, the first transistor being configured for conducting a high portion of an input signal, the second transistor being configured for conducting a low portion of the input signal. The coupling of the input signal to the first transistor input node is interrupted before coupling the input signal to a second transistor input node. The input signal is then coupled to the second transistor input node. The coupling of the input signal to the second transistor input node is interrupted before coupling the input signal to the first transistor input node.

Coupling the input signal to the first transistor input node can be interrupted by a third transistor having a third transistor threshold voltage between of about 90 and about 110 percent of a second transistor threshold voltage. Coupling the input signal to the second transistor input node can be interrupted by a fourth transistor having a fourth transistor threshold voltage between of about 90 and about 110 percent of a first transistor threshold voltage.

The input signal can be coupled to the first transistor input node through a first logic gate and wherein the first logic gate is disabled until the second transistor is in a non-conducting state. The input signal can be coupled to the second transistor input node through a second logic gate and wherein the second logic gate is disabled until the first transistor is in a non-conducting state.

Yet another embodiment provides an analog make before break system including a first transistor coupled in series with a second transistor, the first transistor being configured for conducting a high portion of an input signal, the second transistor being configured for conducting a low portion of the input signal. A first interrupt device is coupled between the input signal and a first transistor input node. The first interrupt device configured interrupt coupling the input signal to the first transistor input node when the second transistor is in a conducting state. A second interrupt device is coupled between the input signal and a second transistor input node. The second interrupt device configured interrupt coupling the input signal to the second transistor input node when the first transistor is in a conducting state.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIGS. 2A is graphical representation of ideal gate voltages applied to an improved driver circuit as the low side driver Q1 stops conducting and the high side driver Q2 begins conducting, for implementing embodiments of the present disclosure.

DETAILED DESCRIPTION

Figure 1A:
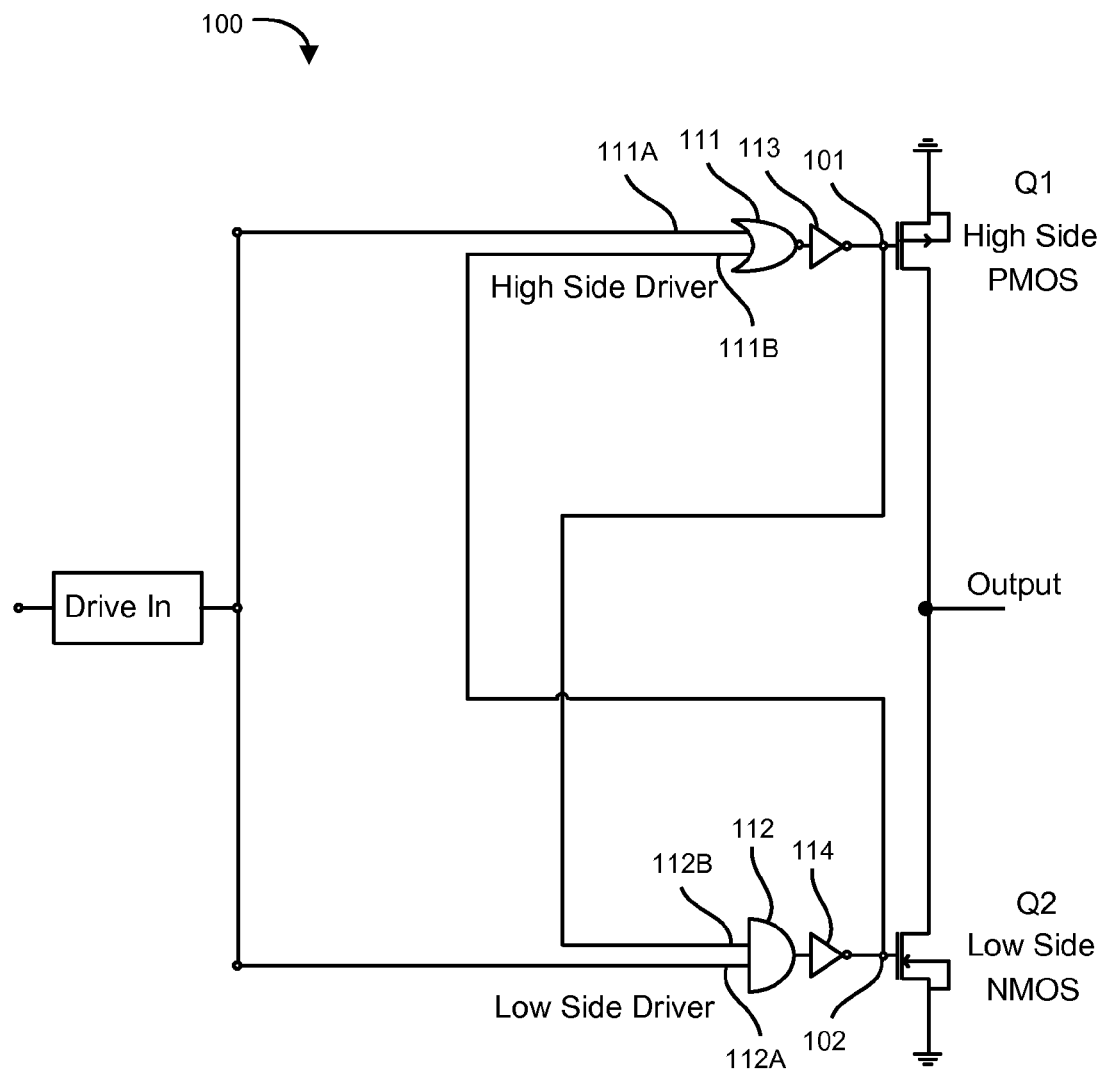
FIG. 1A is a typical driver circuit.

Several exemplary embodiments for systems and methods or operating a driver circuit that does not suffer series current spikes will now be described. It will be apparent to those skilled in the art that the present invention may be practiced without some or all of the specific details set forth herein.

One approach to prevent series current spikes is to place a coupling transistor in each of the respective input nodes of the high side transistor and the low side transistor. Each of the coupling transistors closely matches the gate voltage point of the respective driver transistor providing the input to the coupling transistor. As a result, the coupling transistor cannot gate the cycling on transistor until after the cycling off transistor is in a fully non-conducting state, thereby preventing a series current spike.

FIGS. 2A is graphical representation of ideal gate voltages 221, 222 applied to an improved driver circuit 300 as the low side driver Q1 stops conducting and the high side driver Q2 begins conducting, for implementing embodiments of the present disclosure. As shown an ideal gate voltage 222 for a Q2 low side NMOS driver is initially a high value V1 such that Q2 is in a fully conducting state (state 1). At a time T3 the gate voltage 222 drops immediately to a minimum voltage Vmin and Q2 immediately stops conducting such that Q2 is in a fully non-conducting state (state 0) at time T3. Similarly, an ideal gate voltage 221 for a Q1 high side PMOS driver is initially a high value V1 such that Q1 is in a fully non-conducting state (state 0). At a time T2 the gate voltage 221 drops immediately to a minimum voltage Vmin and Q1 immediately switches to a fully conducting state (state 1) at time T2. Because time T2 occurs after time T3, the series current spike is avoided because Q2 is in a fully non-conducting state before Q1 begins conducting.

Figure 2B:
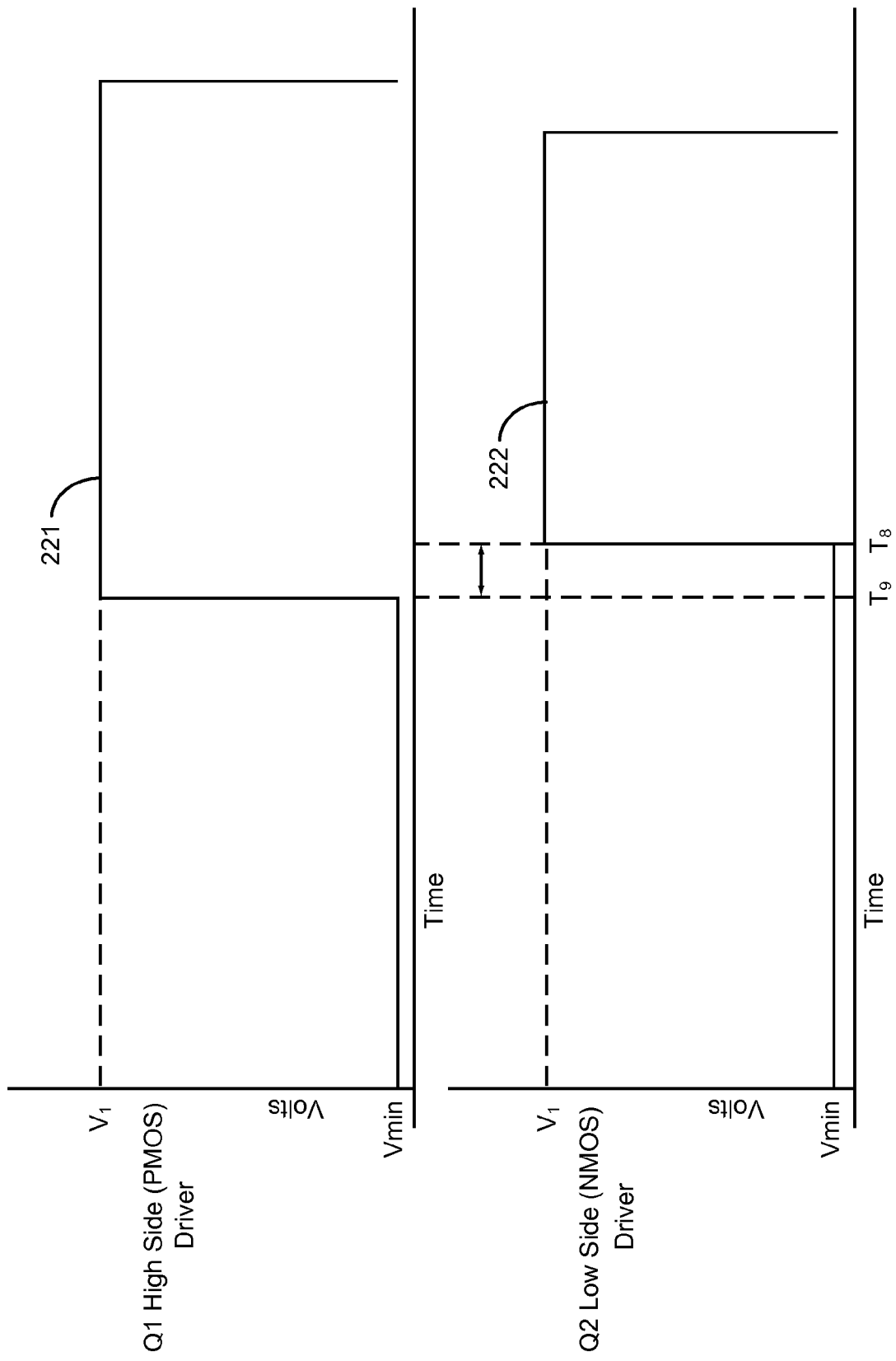
FIGS. 2B is a graphical representation of ideal gate voltages applied to the improved driver circuit as the high side driver Q2 stops conducting and the low side driver Q1 begins conducting, for implementing embodiments of the present disclosure.

FIGS. 2B is a graphical representation of ideal gate voltages 221, 222 applied to the improved driver circuit 300 as the high side driver Q2 stops conducting and the low side driver Q1 begins conducting, for implementing embodiments of the present disclosure. Continuing from FIG. 2A, the gate voltage 221 for a Q1 high side PMOS driver is a minimum voltage (Vmin) such that Q1 is in a fully conducting state (state 1). At a time T9 the gate voltage 221 rises immediately to a high value voltage V1 and Q1 immediately stops conducting such that Q1 is in a fully non-conducting state (state 0) at time T9. Similarly, the ideal gate voltage 222 for a Q2 low side NMOS driver is at a minimum voltage Vmin such that Q2 is in a fully non-conducting state (state 0). At a time T8 the gate voltage 222 rises immediately to a high state voltage V1 and Q2 immediately switches to a fully conducting state (state 1) at time T8. Because time T8 occurs after time T9, the series current spike is avoided because Q1 is in a fully non-conducting state before Q2 begins conducting.

As stated above, the ideal gate voltages 221, 222 are able to switch from a high state (V1) to a low state (Vmin) instantaneously (i.e., with a vertical slope). Unfortunately, actual electrical circuits do not switch instantaneously. The timing of the conducting states (state 1) of transistors Q1 and Q2 can be selected to prevent the conducting states (state 1) of transistors Q1 and Q2 from overlapping and the series current spike.

Figure 3:
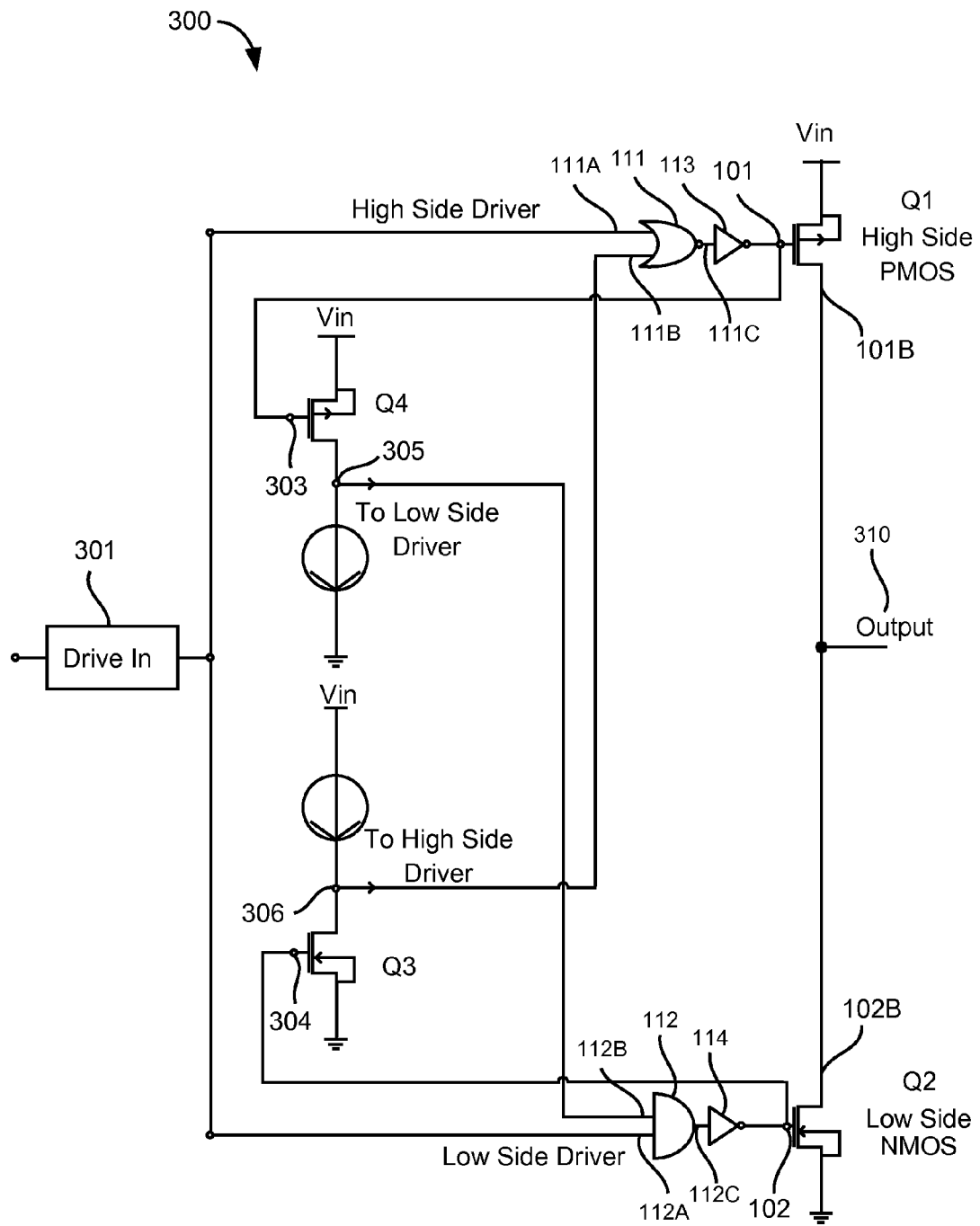
FIG. 3 is a schematic diagram of the analog make before break circuit, for implementing embodiments of the present disclosure.

FIG. 3 is a schematic diagram of the analog make before break circuit 300, for implementing embodiments of the present disclosure. PMOS high side transistor Q1 is connected in series with an NMOS low side transistor Q2 between a supplied voltage source Vin and a ground potential. The improved driver circuit 300 includes a transistor Q3 coupled to a first input node 111B of logic NOR gate 111. An output 111C of the NOR gate 111 is coupled to the input node 101 of transistor Q1 through inverter 113. The input signal 301 is coupled to a second input node 111A of NOR gate 111. The transistor Q4 input 303 is coupled to the input node 101 of transistor Q1.

The circuit 300 also includes a transistor Q4 coupled to a first input 112B of logic AND gate 112. An output 112C of the AND gate 112 is coupled to the input node 102 of the low side transistor Q2 through inverter 114. The input signal 301 is also coupled to a second input node 112A of AND gate 112. The transistor Q3 input 304 is coupled to the input node 102 of transistor Q2. An output 310 of the analog make before break circuit 300 is coupled to the output nodes 101B and 102B of transistors Q1 and Q2, respectively.

Figure 1B:
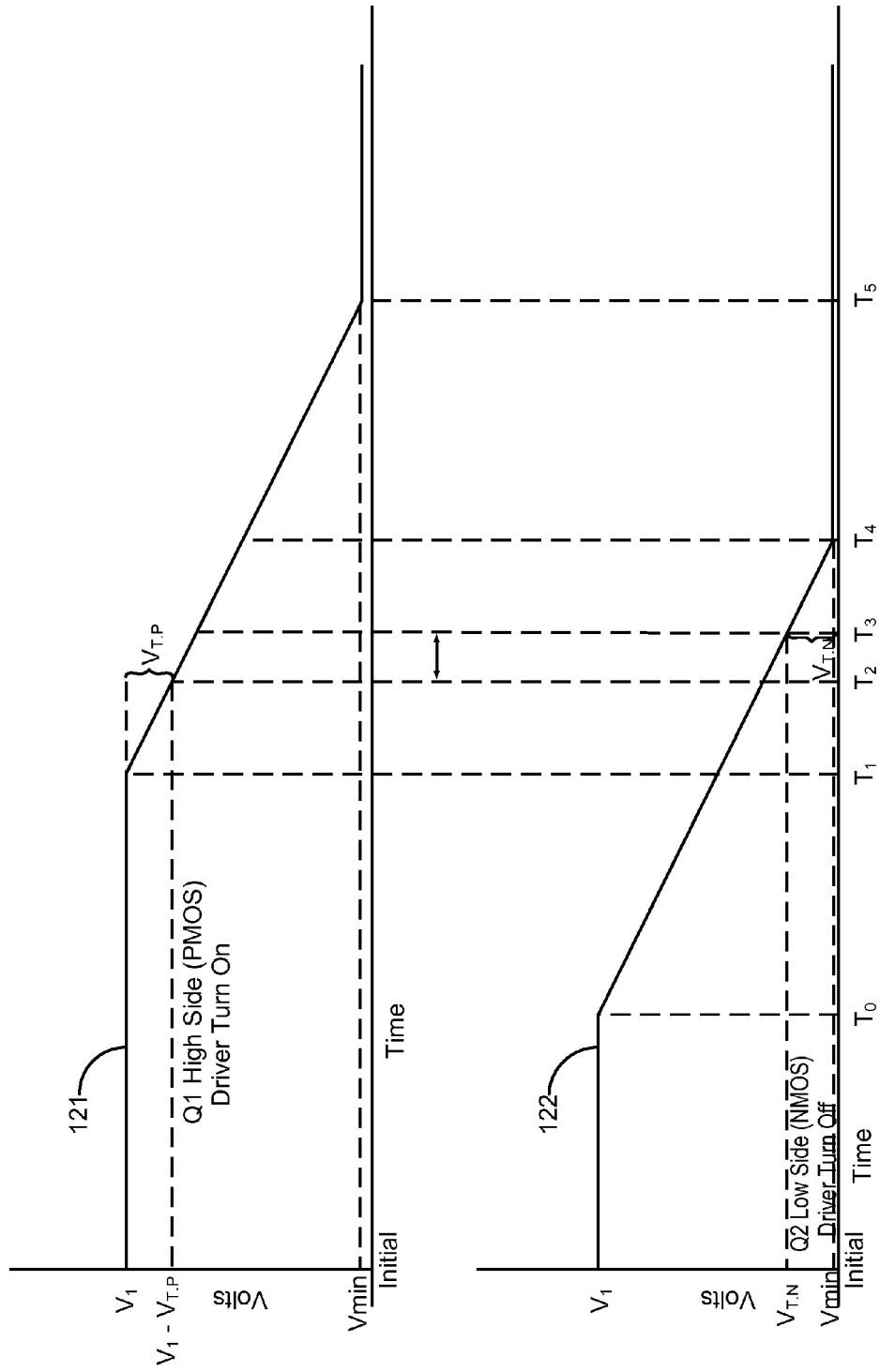
FIGS. 1B and 1C are graphical representations of gate voltages applied to the typical driver circuit.
Figure 1C:
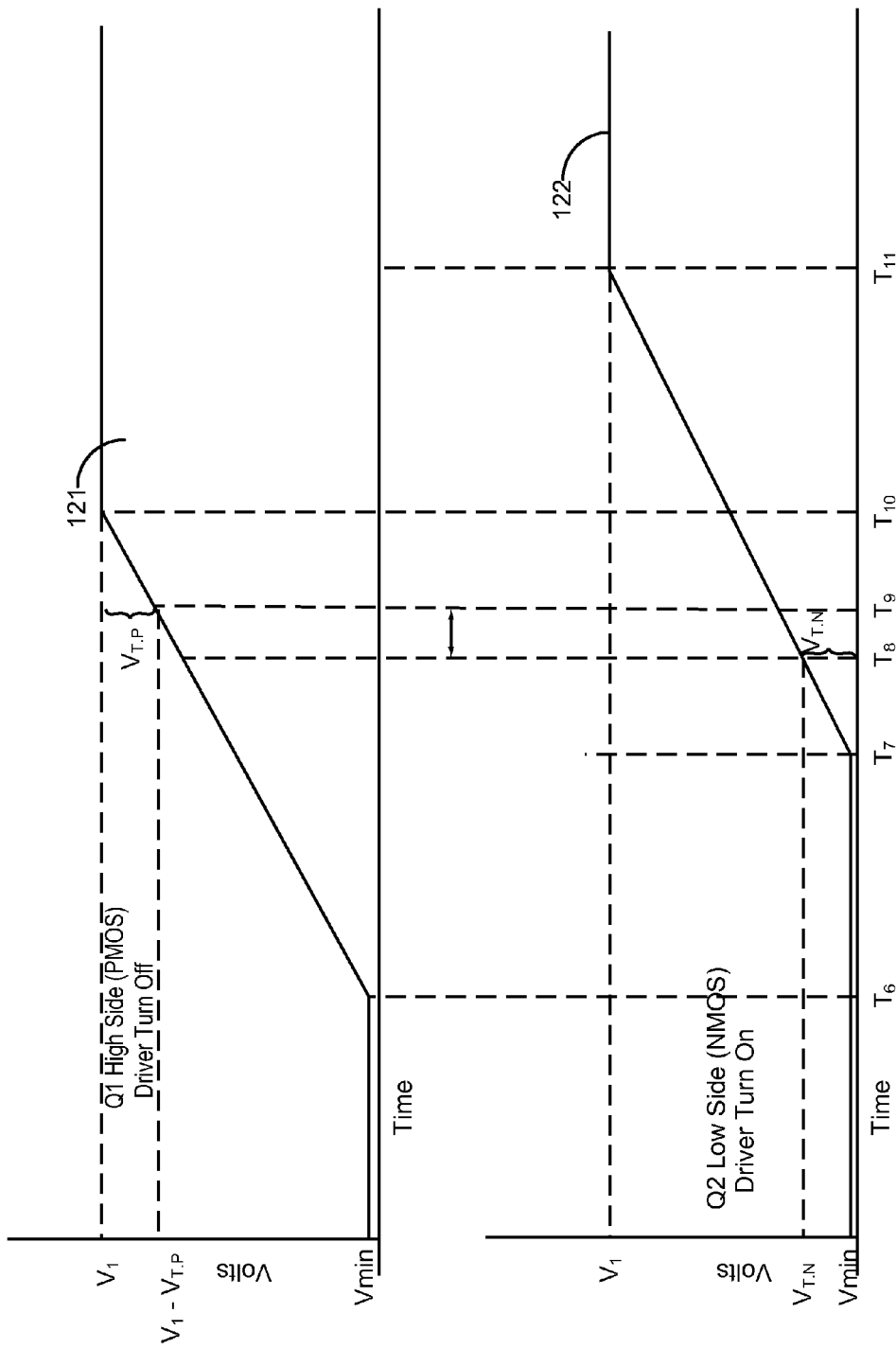

The transistor Q4 delays the low side transistor Q2 conducting (state 1) and can have a threshold voltage between about 90 and 110 percent of the threshold voltage of the high side transistor Q1. In one implementation, the Q4 threshold voltage is substantially equal to the Q1 threshold voltage. The source current value can be optimized (lower current increases the delay time), in order to delay signal 305 to ensure the high side transistor Q1 will fully non-conducting (state 0) before low side transistor Q2 begins to conduct (state 1), thereby avoiding the series current spikes described in FIGS. 1A-C above.

Similarly, transistor Q3 delays the high side transistor Q1 conducting (state 1) and can have a threshold voltage between about 90 and 110 percent of the threshold voltage of the low side transistor Q2. In one implementation, the Q3 threshold voltage can be substantially equal to the Q2 threshold voltage. The sink current value can be optimized (lower current increase the delay time) in order to delay signal 306 to ensure the low side transistor Q2 will fully non-conducting (state 0) before high side transistor Q1 begins to conduct (state 1), thereby avoiding the series current spikes described in FIGS. 1A-C above.

Figure 4A:
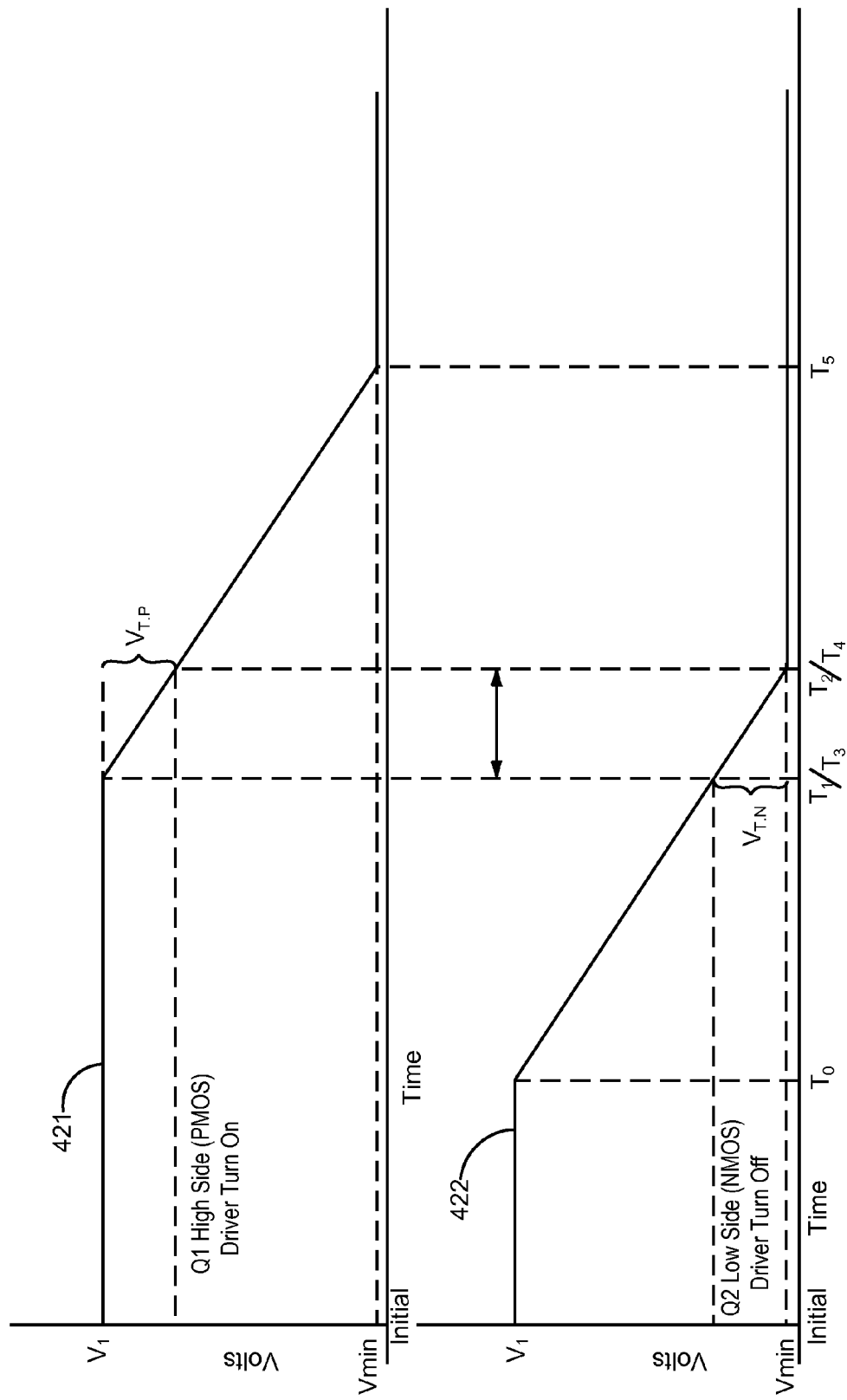
FIGS. 4A is graphical representation of gate voltages applied to an improved driver circuit as the low side driver Q1 stops conducting and the high side driver Q2 begins conducting, for implementing embodiments of the present disclosure.

FIGS. 4A is graphical representation of gate voltages 421, 422 applied to an improved driver circuit 300 as the low side driver Q1 stops conducting and the high side driver Q2 begins conducting, for implementing embodiments of the present disclosure. As shown a gate voltage 422 for the Q2 low side NMOS driver is initially a high value V1 such that Q2 is in a fully conducting state (state 1). At a time T0 the gate voltage 422 is disabled or removed. However, the Q2 gate voltage 422 does not drop to minimum level Vmin, instantaneously and thus Q2 does not stop conducting immediately. The gate voltage 422 drops between time T0 and T2 to the minimum voltage Vmin As the bias voltage 422 drops to lower than Q2's threshold voltage Vtn, Q2 stops conducting such that Q2 is in a fully non-conducting state (state 0) at time T3.

The gate voltage 421 for the Q1 high side PMOS driver is initially a high value V1 such that Q1 is in a fully non-conducting state (state 0). Q1 gate voltage 421 has a downward slope as the gate voltage gradually decreases between time T1 and time T5. At a time T2, the Q1 gate voltage 421 drops below a threshold voltage $V_{TP}$ for transistor Q1 and driver transistor Q3.

At time T2, transistor Q3 begins conducting. After transistor Q3 begins conducting, the input 111B of the NOR gate 111 is pulled low, thus allowing the driver input signal from the input 303 to be conducted to the input of transistor Q1 and transistor Q1 can begin conducting (state 1) some time after time T2. Because time T2 occurs after time T3, the series current spike is avoided because transistor Q2 is in a fully non-conducting state before transistor Q1 begins conducting.

Figure 4B:
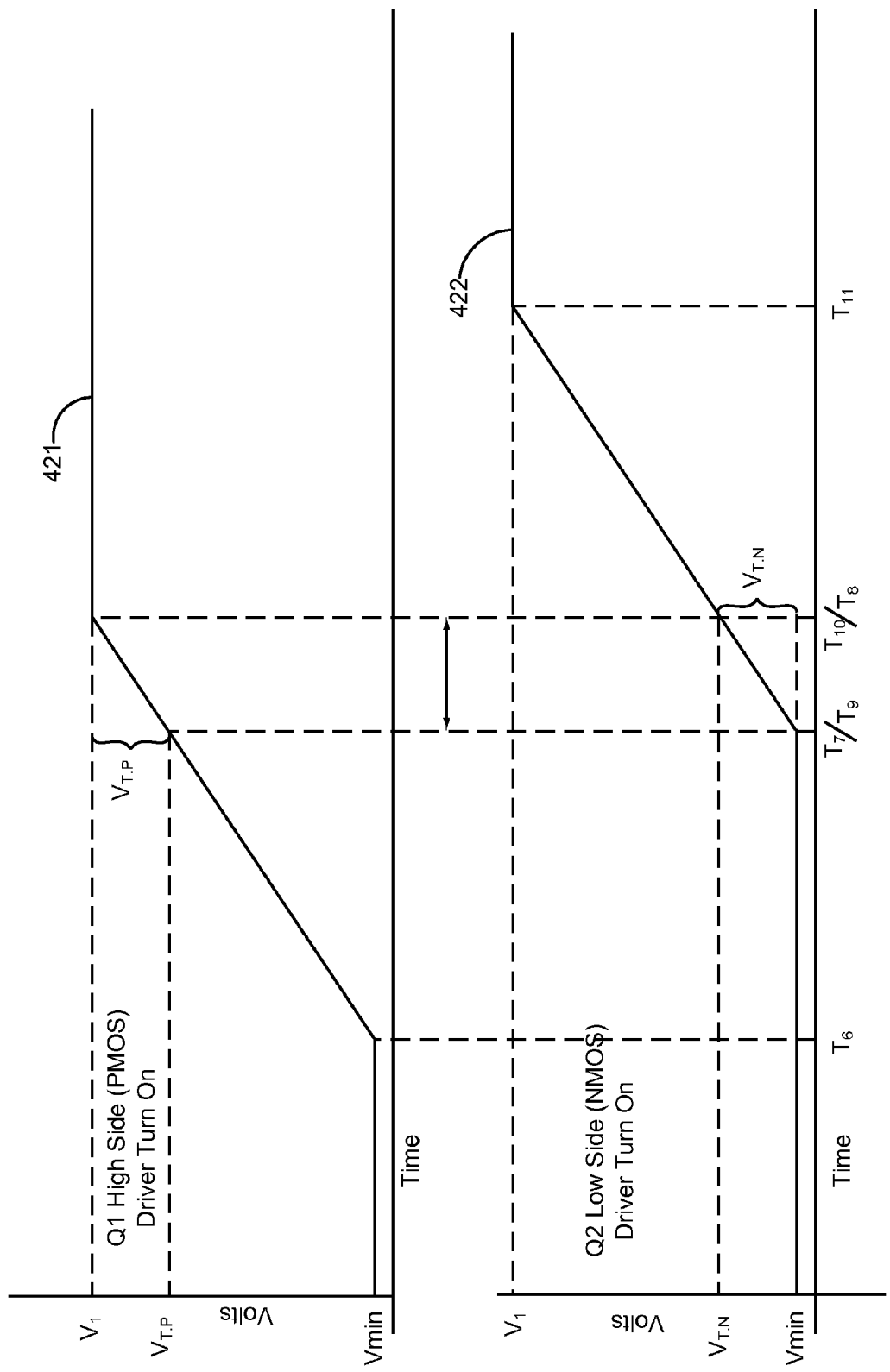
FIGS. 4B is a graphical representation of gate voltages applied to the improved driver circuit as the high side driver Q2 stops conducting and the low side driver Q1 begins conducting, for implementing embodiments of the present disclosure.

FIGS. 4B is a graphical representation of gate voltages 421, 422 applied to the improved driver circuit 300 as the high side driver transistor Q2 stops conducting and the low side driver transistor Q1 begins conducting, for implementing embodiments of the present disclosure. Continuing from FIG. 4A, the gate voltage 421 for a transistor Q1 high side PMOS driver is a minimum voltage (Vmin) such that transistor Q1 is in a fully conducting state (state 1). At a time T6 the gate voltage 421 begins to rise to a high value voltage V1 at time T8. At time T7, the gate voltage 421 rises above threshold voltage Vtn of the transistor Q3 and transistor Q3 stops conducting (state 0). After transistor Q3 stops conducting, the input 111B of the NOR gate 111 is pulled higher, thus blocking the driver input signal from the input 303 from be conducted to the input of transistor Q1 and transistor Q1 stops conducting (state 0) some time after time T7.

Continuing from FIG. 4A, the gate voltage 422 for a transistor Q2 low side NMOS driver is a minimum voltage (Vmin) such that transistor Q2 is in a fully non-conducting state (state 0). At time T9, the gate voltage 422 for a Q2 begins to rise to a maximum level V1 at time T11. At time T10, the gate voltage 422 rises above a threshold voltage V for transistor Q2 and transistor Q4.

At time T10, transistor Q4 begins conducting. After transistor Q4 begins conducting, the input 112B of the AND gate 112 is pulled low, thus allowing the driver input signal from the input 303 to be conducted to the input of transistor Q2 and Q2 can begin conducting (state 1) some time after time T10. Because time T10 occurs after time T7, the series current spike is avoided because Q1 is in a fully non-conducting state before Q2 begins conducting.

Figure 5:
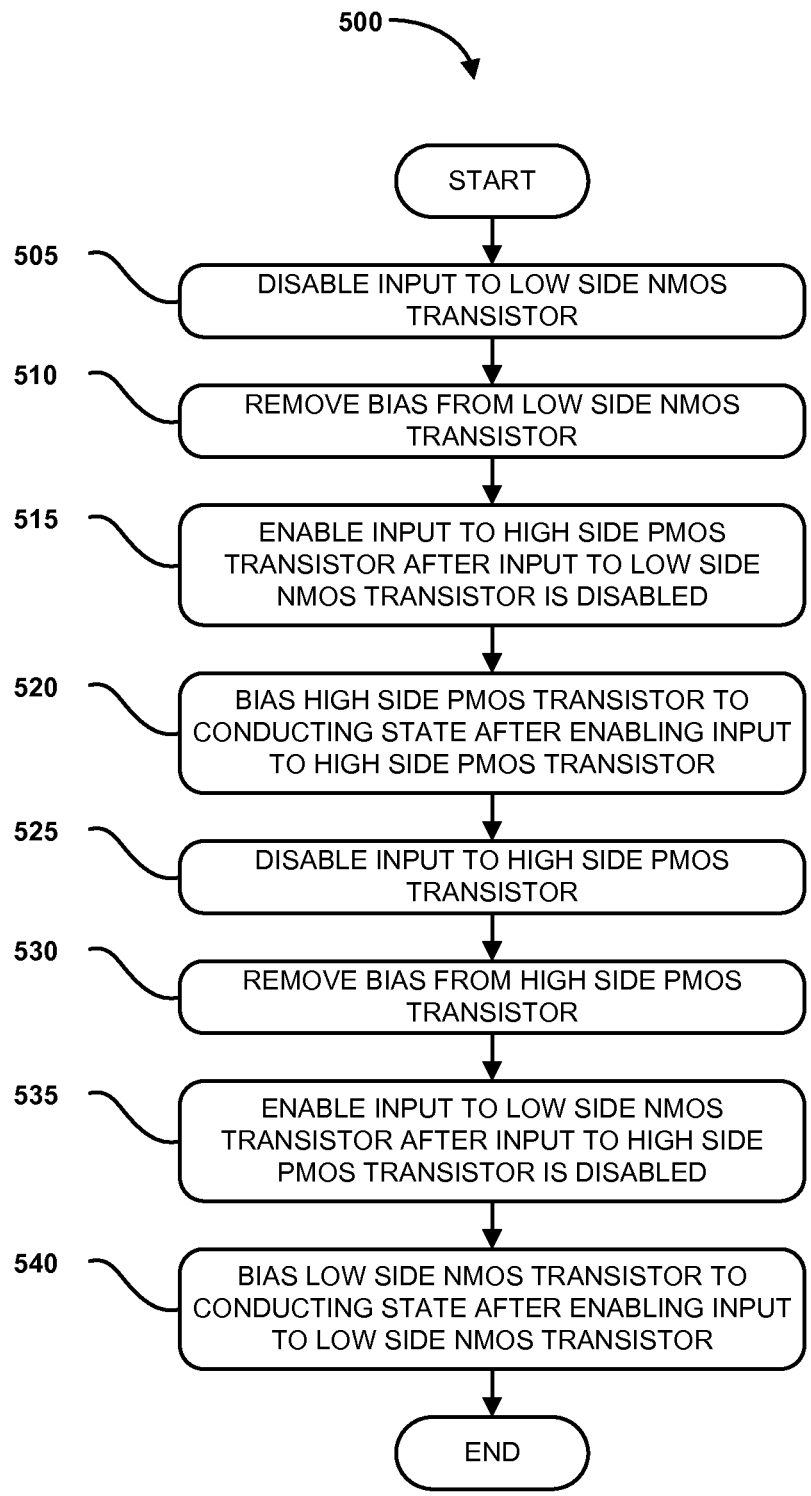
FIG. 5 is a flowchart diagram that illustrates the method operations performed in preventing the series current spikes, for implementing embodiments of the present disclosure.

FIG. 5 is a flowchart diagram that illustrates the method operations performed in preventing the series current spikes, for implementing embodiments of the present disclosure. The operation of the improved driver circuit 300 can be summarized as following operations. Beginning with an initial state of the low side NMOS transistor Q2 conducting (state 1) and the high side PMOS transistor Q1 is in a non-conducting (state 0). In an operation 505, the input to the low side NMOS transistor Q2 is disabled and the gate voltage is removed from transistor Q2 in an operation 510 to place Q2 in a non-conducting state (state 0).

At some time after disabling the input to low side transistor Q2, the input to the high side transistor Q1 is enabled in an operation 515. The high side transistor Q1 is gated to a conducting state (state 1), in an operation 520.

When the gate voltage switches to low state, in an operation 525, the input to the high side transistor Q1 is disabled and the gate is removed from Q1 in an operation 530 to place Q1 in a non-conducting state (state 0).

At some time after disabling the input to high side transistor Q1, the input to the low side transistor Q2 is enabled in an operation 535. The low side transistor Q2 is gated to a conducting state (state 1), in an operation 540.

As stated above, the examples of PMOS and NMOS transistors Q1, Q3 and Q2, Q4, respectively, are merely exemplary and it should be understood that different types of transistors can be used similarly.

It should be understood that the above described driver circuit is merely an example for purposes of discussion of the operating principles and the circuit structure and design. Other circuits and devices can also include the improvements described above. By way of example, a switching regulator driver, an inverter and any other circuit with a high side MOS transistor in a serial connection with a low side MOS transistor.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive of a computer.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An analog make before break circuit comprising:
   a first transistor coupled in series with a second transistor, the first transistor being configured for conducting a high portion of an input signal, the second transistor being configured for conducting a low portion of the input signal; and
   a first interrupt device coupled between the input signal and a first transistor input node, the first interrupt device configured to interrupt coupling the input signal to the first transistor input node when the second transistor is in a conducting state, the first interrupt device including a first logic gate, the first logic gate being disabled until the second transistor is in a non-conducting state.

2. The circuit of claim 1, wherein the first interrupt device includes a third transistor configured to interrupt the connection between the input signal and the first logic gate includes a NOR gate and the first transistor input node includes:
   coupling a third transistor input node to the second transistor input node;
   coupling the input signal to a first NOR gate input node;
   coupling a third transistor output node to a second NOR gate input node; and
   coupling an NOR gate output node to the first transistor input node.

3. The circuit of claim 1, further comprising a second interrupt device coupled between the input signal and a second transistor input node, the second interrupt device configured to interrupt coupling the input signal to the second transistor input node when the first transistor is in a conducting state, the second interrupt device including a second logic gate, the second logic gate being disabled until the first transistor is in a non-conducting state.

4. The circuit of claim 3, wherein the second interrupt device includes a fourth transistor configured to interrupt the connection between the input signal and the second logic gate includes an AND gate and the second transistor input node includes:
   coupling a fourth transistor input node to the first transistor input node;
   coupling the input signal to a first AND gate input node;
   coupling a fourth transistor output node to a second AND gate input node; and
   coupling an AND gate output node to the second transistor input node.

5. The circuit of claim 2, wherein the second transistor threshold voltage is substantially equal to the third transistor threshold voltage.

6. The circuit of claim 1, wherein the first transistor threshold voltage is substantially equal to the second transistor threshold voltage.

7. The circuit of claim 1, wherein the first transistor threshold voltage is not equal to the second transistor threshold voltage.

8. The circuit of claim 1, wherein the first transistor is coupled in series with the second transistor between a supply voltage source and a ground potential.

9. The circuit of claim 1, further comprising an analog make before break circuit output node coupled between a first transistor output node and a second transistor output node.

10. A method of providing an analog make before break comprising:
    coupling an input signal from an analog make before break circuit input node an to a first transistor input node wherein a first transistor is coupled in series with a second transistor, the first transistor being configured for conducting a high portion of an input signal, the second transistor being configured for conducting a low portion of the input signal;
    interrupting the coupling of the input signal to the first transistor input node before coupling the input signal to a second transistor input node through a first interrupt device coupled between the input signal and a first transistor input node, the first interrupt device configured to interrupt coupling the input signal to the first transistor input node when the second transistor is in a conducting state, the first interrupt device including a first logic gate, the first logic gate being disabled until the second transistor is in a non-conducting state;
    coupling the input signal to the second transistor input node; and
    interrupting the coupling of the input signal to the second transistor input node before coupling the input signal to the first transistor input node.

11. The method of claim 10, wherein coupling the input signal to the first transistor input node is interrupted by a third transistor having a third transistor threshold voltage between of about 90 and about 110 percent of a second transistor threshold voltage.

12. The method of claim 10, wherein coupling the input signal to the second transistor input node is interrupted by a fourth transistor having a fourth transistor threshold voltage between of about 90 and about 110 percent of a first transistor threshold voltage.

13. The method of claim 10, wherein interrupting the coupling of the input signal to the second transistor input node before coupling the input signal to the first transistor input node includes coupling the input signal to the second transistor input node through a second interrupt device coupled between the input signal and a second transistor input node, the second interrupt device configured to interrupt coupling the input signal to the second transistor input node when the first transistor is in a conducting state, the second interrupt device including a second logic gate, the second logic gate being disabled until the first transistor is in a non-conducting state.

14. The circuit of claim 1, wherein the first interrupt device includes a third transistor having a third transistor threshold voltage between of about 90 and about 110 percent of a second transistor threshold voltage.

15. The circuit of claim 14, wherein the third transistor configured to interrupt the connection between the input signal and the first transistor input node includes:
    coupling a third transistor input node to the second transistor input node;

coupling the input signal to a first NOR gate input node;
coupling a third transistor output node to a second NOR gate input node; and
coupling an NOR gate output node to the first transistor input node.

16. The circuit of claim 3, wherein the second interrupt device includes a fourth transistor having a fourth transistor threshold voltage of between about 90 and about 110 percent of a first transistor threshold voltage.

17. The circuit of claim 16, wherein the fourth transistor configured to interrupt the connection between the input signal and the second transistor input node includes:
coupling a fourth transistor input node to the first transistor input node;
coupling the input signal to a first AND gate input node;
coupling a fourth transistor output node to a second AND gate input node; and
coupling an AND gate output node to the second transistor input node.

18. The circuit of claim 16, wherein the first transistor threshold voltage is not equal to the second transistor threshold voltage.

19. The circuit of claim 4, wherein the first transistor threshold voltage is substantially equal to the fourth transistor threshold voltage.

20. An analog make before break system comprising:

a first transistor coupled in series with a second transistor, the first transistor being configured for conducting a high portion of an input signal, the second transistor being configured for conducting a low portion of the input signal;

a first interrupt device coupled between the input signal and a first transistor input node, the first interrupt device configured to interrupt coupling the input signal to the first transistor input node when the second transistor is in a conducting state, the first interrupt device including a first logic gate, the first gate being disabled until the second transistor is in a non-conducting state; and a second interrupt device coupled between the input signal and a second transistor input node, the second interrupt device configured to interrupt coupling the input signal to the second transistor input node when the first transistor is in a conducting state, the second interrupt device including a second logic gate, the second logic gate being disabled until the first transistor is in a non-conducting state.

* * * * *